United States Patent
Nozue

Patent Number: 5,552,250
Date of Patent: Sep. 3, 1996

[54] METHOD OF MANUFACTURING RETICLE

[75] Inventor: Hiroshi Nozue, Tokyo, Japan

[73] Assignee: NEC Corporation, Tokyo, Japan

[21] Appl. No.: 334,065

[22] Filed: Nov. 4, 1994

[30] Foreign Application Priority Data

Nov. 15, 1993 [JP] Japan ................................ 5-306997

[51] Int. Cl.$^6$ ........................................................ G03F 9/00
[52] U.S. Cl. ........................................ 430/5; 430/296
[58] Field of Search ...................................... 430/5, 296

[56] References Cited

U.S. PATENT DOCUMENTS 5,202,204  4/1993  Kawahira et al. .......................... 430/5

FOREIGN PATENT DOCUMENTS 61-214518  9/1986  Japan .
3-15065  1/1991  Japan .

Primary Examiner—S. Rosasco
Attorney, Agent, or Firm—Foley & Lardner

[57] ABSTRACT

A method of manufacturing a reticle having a desired pattern, includes the step of projecting electron beams to a mask blank including a glass substrate on which an electron beam sensitive layer is applied. The mask blank is held in place in the same situation as a situation in which the reticle is held when a stepper exposes a semiconductor wafer to light through said reticle. For instance, the mask blank being in place so that the electron beam sensitive layer faces downwardly and the electron beams is projected from a bottom of the layer. The method can eliminate dimensional errors of a pattern and a dislocation of a pattern on a semiconductor wafer which might occur due to a curvature of a reticle.

6 Claims, 5 Drawing Sheets

METHOD OF MANUFACTURING RETICLE

BACKGROUND OF THE INVENTION

1. Field of the Invention

The invention relates to method of manufacturing a reticle used in a photolithography step which is one of the steps for manufacturing a semiconductor integrated circuit device.

2. Description of the Related Art

In manufacturing a semiconductor integrated circuit device, a photolithography step is adopted for forming a micro pattern with high accuracy on a semiconductor wafer. In the photolithography step, there is used a so-called "reticle". The reticle is composed of a glass substrate such as quartz on which is formed a circuit pattern composed of material such as chromium which prevents ultraviolet rays from transmitting therethrough. The reticle is set in a stepper which is an apparatus for exposing a semiconductor wafer to light, and the circuit pattern formed on the reticle is imaged by the stepper to a semiconductor substrate to thereby fabricate an integrated circuit device.

FIG. 1 schematically illustrates a stepper. A semiconductor wafer W, which will form a semiconductor integrated circuit device, is placed on an X-Y stage 31 which is movable both in X and Y directions. On an upper surface of the wafer W is formed an electrically conductive layer comprising a circuit, and on the electrically conductive layer is formed a photoresist. Above the X-Y stage 31 is disposed a lens 32, and above the lens 32 is disposed a reticle 200 held by a holder 34. Above the reticle 200 is disposed a light source 33 which radiates ultraviolet rays. By radiating ultraviolet rays from the light source 33 to the reticle 200, the circuit pattern formed on the reticle 200 is image-formed on an upper surface of the semiconductor wafer W. Next, the wafer W is exposed to light. Then, the photoresist is developed to thereby leave only portions corresponding to the circuit pattern. By etching the electrically conductive layer using a residual photoresist as a mask, a desired electrically conductive pattern is obtained.

Thus, if the circuit pattern is formed on a glass substrate with low accuracy, for instance, with respect to location of a pattern and dimension of a pattern, final products, namely semiconductor integrated circuit devices, can have only low level of performance or may be non-conforming. Thus, it is quite important to form a circuit pattern on a glass substrate with high accuracy.

A reticle is manufactured generally by means of an electron beam exposure apparatus. FIG. 2 schematically illustrates a conventional electron beam exposure apparatus. On vibration isolators 41 is disposed a vacuum chamber 43 which is reduced in pressure by a vacuum system 42 such as a vacuum pump. In the vacuum chamber 43 is disposed an X-Y stage 44 movable in both X and Y directions, and on the X-Y stage 44 is placed a holder 45 for holding a mask blank 100 from which a reticle will be fabricated. As illustrated in FIG. 3A, the mask blank 100 comprises a glass substrate G on which a chromium layer C is applied, and on the chromium layer C is applied an electron beam resist R.

The mask blank 100 is set on the X-Y stage 44 and fixed with the holder 45 with the chromium layer C and the resist R facing upwardly. Electron beams E radiated from an electron gun 46 is optimized by an electronic optical system 47, and then is radiated on the mask blank 100. Concurrently with the radiation of the electron beams E, data about a circuit pattern to be formed on the mask blank 100 is transformed by means of a data transformer 48 to a format suitable for image-formation. Based on the suitably transformed format, the controller 49 controls the electronic optical system 47 and the X-Y stage 44 to thereby image-form a desired pattern on the mask blank 100. Subsequently to the image-formation, the electron beam resist R is developed, and then the chromium layer C is etched using the residual resist R as a mask and further the resist is removed to thereby form a chromium pattern. Thus, a reticle is completed.

As having aforementioned, when a semiconductor integrated circuit device is manufactured using a thus fabricated reticle, as illustrated in FIG. 1, the reticle 100 is held by the holder 34 in the stepper with the chromium layer C formed on the glass substrate facing downwardly. The reason why the chromium layer C is kept facing downwardly is to avoid debris such as dust from attaching to a circuit pattern formed on the chromium layer C, because if debris is attached to the pattern, images of the debris might be transferred together with the images of the pattern to a semiconductor wafer, and thereby a semiconductor device is made to be non-conforming.

However, since the reticle 200 is held with the holder 34 at peripheral portions thereof, the reticle 200 is bent downwardly at a central portion thereof, namely the reticle 200 has a downward curvature due to a dead weight of the glass substrate. A curvature of the glass substrate generated when the glass substrate is held with the chromium layer C facing upwardly is different from a curvature of the glass substrate generated when the glass substrate is held with the chromium layer C facing downwardly. This is because that a stress of the chromium layer C as well as a dead weight of the glass substrate exerts on the glass substrate.

As aforementioned, the mask blank is held in the electron beam exposure apparatus with the chromium layer C facing upwardly as illustrated in FIG. 2, whereas the reticle 200 is held in the stepper with the chromium layer C facing downwardly as illustrated in FIG. 1. FIG. 3B illustrates a curvature of the glass substrate G held in the electron beam exposure apparatus, whereas FIG. 3D illustrates a curvature of the glass substrate G held in the stepper.

Now, suppose that a circuit pattern P is intended to be image-formed on the mask blank 100 at a distance X1 from a center O of the mask blank 100, as illustrated in FIG. 3A.

In an apparatus for exposing the mask blank 100 to electron beams, since the mask blank 100 is held on the X-Y stage 44, the mask blank is curved so that a central portion thereof lowers or a peripheral portion thereof raises, as illustrated in FIG. 3B. Hence, if electron beams E are radiated to the mask blank 100 at a distance X1 from the center O of the mask blank 100, the circuit pattern P is located at a distance X2 from the center O of the mask blank 100 when the mask blank 100 is released from the holder 45 to thereby return back to its original shape, namely a flat shape having no curvature, as illustrated in FIG. 3C. Suppose that a line connecting the circuit pattern P to the center O of the mask blank 100 makes an angle $\theta_1$ with a horizontal plane, the distance X2 is represented by the following equation.

$$X2 = X1/\cos\theta_1 > X1$$

Thus, the circuit pattern P is dislocated by a distance X from a point where the circuit pattern P is intended to be formed. The dislocation distance X is represented as follows.

$$X = X2 - X1 = X1(1/\cos\theta_1 - 1)$$

On the other hand, in the stepper, the reticle 200 is held at its peripheral portions with the holder 34, and accordingly the reticle 200 is curved so that a central portion thereof downwardly deforms, as illustrated in FIG. 3D. A curvature of the reticle 200 held in the stepper is larger than the curvature of the mask blank 100 held in the electron beam exposure apparatus. Namely, suppose that a line connecting the circuit pattern P to the center O of the reticle 200 makes an angle $\theta_1$ with a horizontal plane, the angle $\theta_2$ is larger than the angle $\theta_2$. Thus, the circuit pattern P is disposed at a distance X3 from the center O of the reticle 200. The distance X3 is represented as follows.

$$X3 = X2\cos\theta_2$$

Accordingly, the circuit pattern P is dislocated in the stepper by a distance X4 from a point where the pattern P is intended to be formed. The distance X4 is represented as follows.

$$X4 = X1 - X3 \quad = X1 - (X1/\cos\theta_1)\cos\theta_2$$
$$= X1(1 - \cos\theta_2/\cos\theta_1)$$

In a reticle composed of quartz glass and having 6 inches of a diameter and 0.25 inches of a thickness, which is so-called "6025 reticle", the above mentioned dislocation is in the range of 0.05 μm to 0.2 μm at a distance of 50 millimeters from a center of the reticle, and in the range of 0.075 μm to 0.3 μm at a distance of 75 millimeters from a center of the reticle. A conventional stepper uses a ⅕scale-down lens, and hence on a semiconductor wafer there is generated a dislocation of one-fifth of the above mentioned dislocation, namely in the range of 0.01 μm to 0.06 μm. A stepper is required to have an alignment accuracy below 0.1 μm for 16 MDRAM level. Accordingly, if there occurs a dislocation ranging up to 0.06 μm due to a curvature of a reticle, it makes a combined curvature ranging up to 0.16 μm, resulting in that it is impossible to conform semiconductor devices to quality standards.

A glass substrate has conventionally had a large thickness for reducing a curvature of a mask blank or a reticle. However, such a large thickness causes the weight of a glass substrate to be heavy and makes the reticle expensive. Furthermore, a stage for the exposure apparatus is required to be large for supporting the heavy weight.

Japanese Unexamined Patent Public Disclosure No. 61-214518 has suggested a method for exposing a mask blank to electron beams with the mask blank having no curvature. However, even if a reticle is manufactured without having a curvature, such a reticle is not useful if a curvature would occur in the reticle when it is used in a stepper.

Japanese Unexamined Patent Public Disclosure No. 3-15065 has suggested a method of compensating for a pattern in dependence on a degree of a curvature which is generated in accordance with an area of a chromium layer. However, this method does not consider a curvature generated due to a dead weight of a glass substrate, and hence if a curvature due to a dead weight of a glass substrate would occur in a stepper, the method would no longer be useful.

SUMMARY OF THE INVENTION

It is an object of the present invention to provide a method for manufacturing a reticle, capable of eliminating dimensional errors of a pattern and a dislocation of a pattern on a semiconductor wafer.

The invention provides a method of manufacturing a reticle having a desired pattern, including the step of projecting electron beams to a mask blank including a glass substrate on which an electron beam sensitive layer is applied, to thereby manufacture a reticle, the mask blank being held in place in the same situation as a situation in which the reticle is held when a stepper exposes a semiconductor wafer to light through the reticle.

The invention further provides a method of manufacturing a reticle having a desired pattern, including the step of projecting electron beams to a mask blank including a glass substrate on which an is electron beam sensitive layer is applied, to thereby manufacture a reticle, the mask blank being held in place so that the electron beam sensitive layer faces downwardly, and the electron beams being projected from a bottom of said layer.

The invention further provides a method of manufacturing a reticle having a desired pattern, including the step of projecting electron beams to a mask blank including a glass substrate on which an electron beam sensitive layer is applied, to thereby manufacture a reticle, the mask blank being held in place in the same relationship between a direction of a curvature of the mask blank and a direction in which the electron beams are projected, as a relationship of them in which a stepper exposes a semiconductor wafer to light through the reticle.

In a preferred embodiment, the glass substrate further has a light cut-off layer applied thereon.

In another preferred embodiment, the reticle is held only at edge portions thereof both when electron beams are projected to the reticle and when the stepper exposes a semiconductor wafer to light through the reticle.

The advantages obtained by the aforementioned present invention will be described hereinbelow.

As having aforementioned, a mask blank is exposed to electron beams held in the same situation as a situation in which the mask blank is held in a stepper, to thereby form a circuit pattern on the mask blank. Hence, it is ensured that a curvature of a reticle held in a stepper is equal to a curvature of a mask blank held in an electron beam exposing apparatus. This enhances alignment accuracy with which the circuit pattern is image-formed to a semiconductor wafer, thereby permitting manufacturing of low cost semiconductor devices having high performance.

In addition, in the invention, a mask blank is disposed above an electron beam supply so that electron beams are radiated to the mask blank at a bottom of the mask blank. Thus, the mask blank is exposed to electron beams having a certain curvature which is the same one as the mask blank would have when held in a stepper. Accordingly, it is possible to manufacture a reticle having high alignment accuracy with which a circuit pattern is transferred to a semiconductor wafer through the reticle.

Furthermore, in the invention, a mask blank is exposed to electron beams with a curvature of the mask blank remaining as it is. Accordingly, it is not necessary to thicken a glass substrate for reducing a curvature of the glass substrate, and hence it is possible to use a thin glass substrate. This allows the a cost of manufacturing of reticle to be reduced.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A preferred embodiment in accordance with the present invention will be explained hereinbelow with reference to the drawings.

Figure 4:
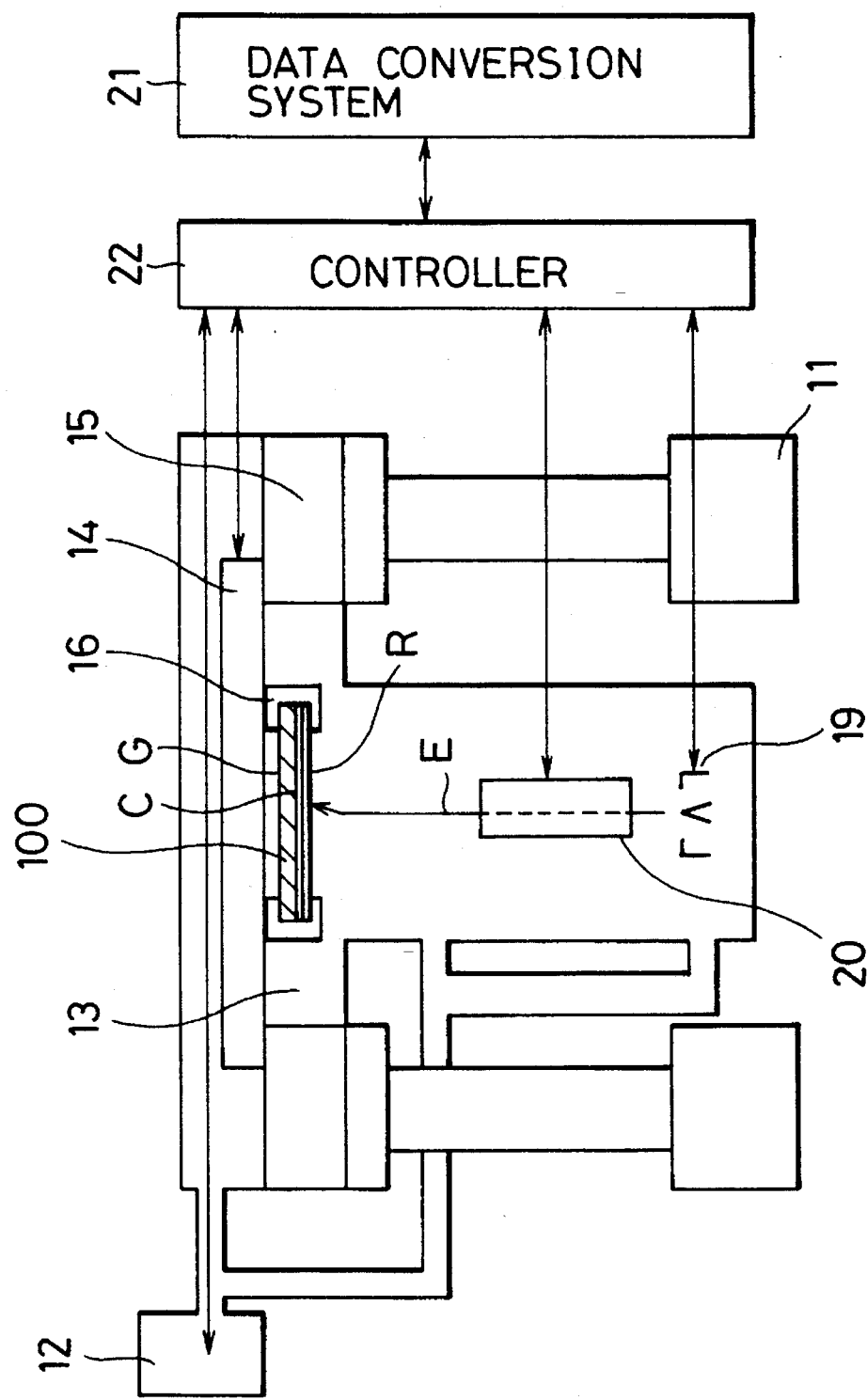
FIG. 4 is a schematic view illustrating an apparatus for radiating electron beams to a mask blank in accordance with an embodiment of the invention.

FIG. 4 illustrates an apparatus for exposing a mask blank to electron beams in accordance with the invention. On vibration insulators 11 a vacuum chamber 13 is supported which is reduced in pressure by means of a vacuum pump 12. In the vacuum chamber 13, an X-Y stage 14 movable in X and Y directions is placed on stage tables 15. To a bottom surface of the X-Y stage 14 is secured a holder 16 by which a mask blank 100 is supported at edge portions thereof. The mask blank 100 comprises a glass substrate G on which a chromium layer C serving as a light cut-off layer is applied, on which chromium layer C is applied an electron beam resist R.

Figure 1:
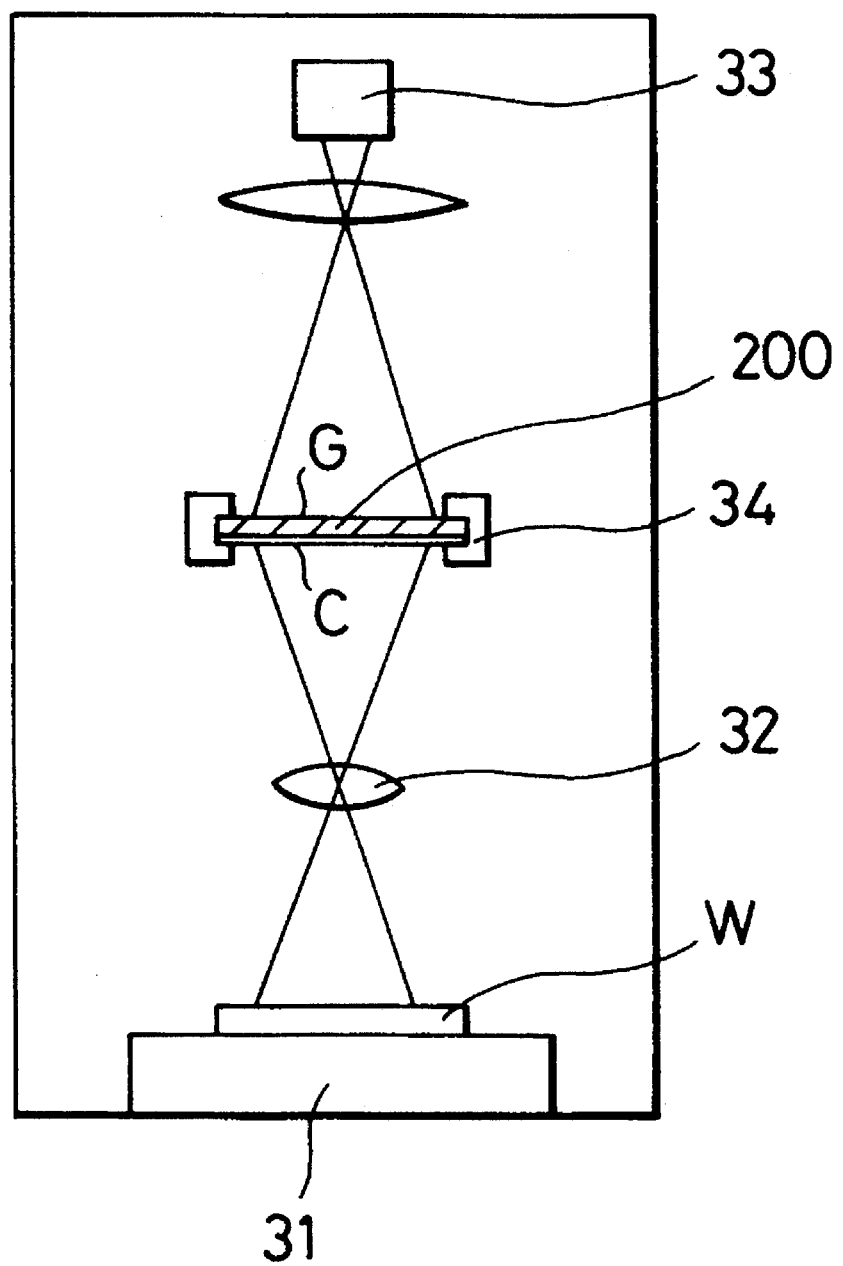
FIG. 1 is a schematic view illustrating a conventional stepper.
Figure 2:
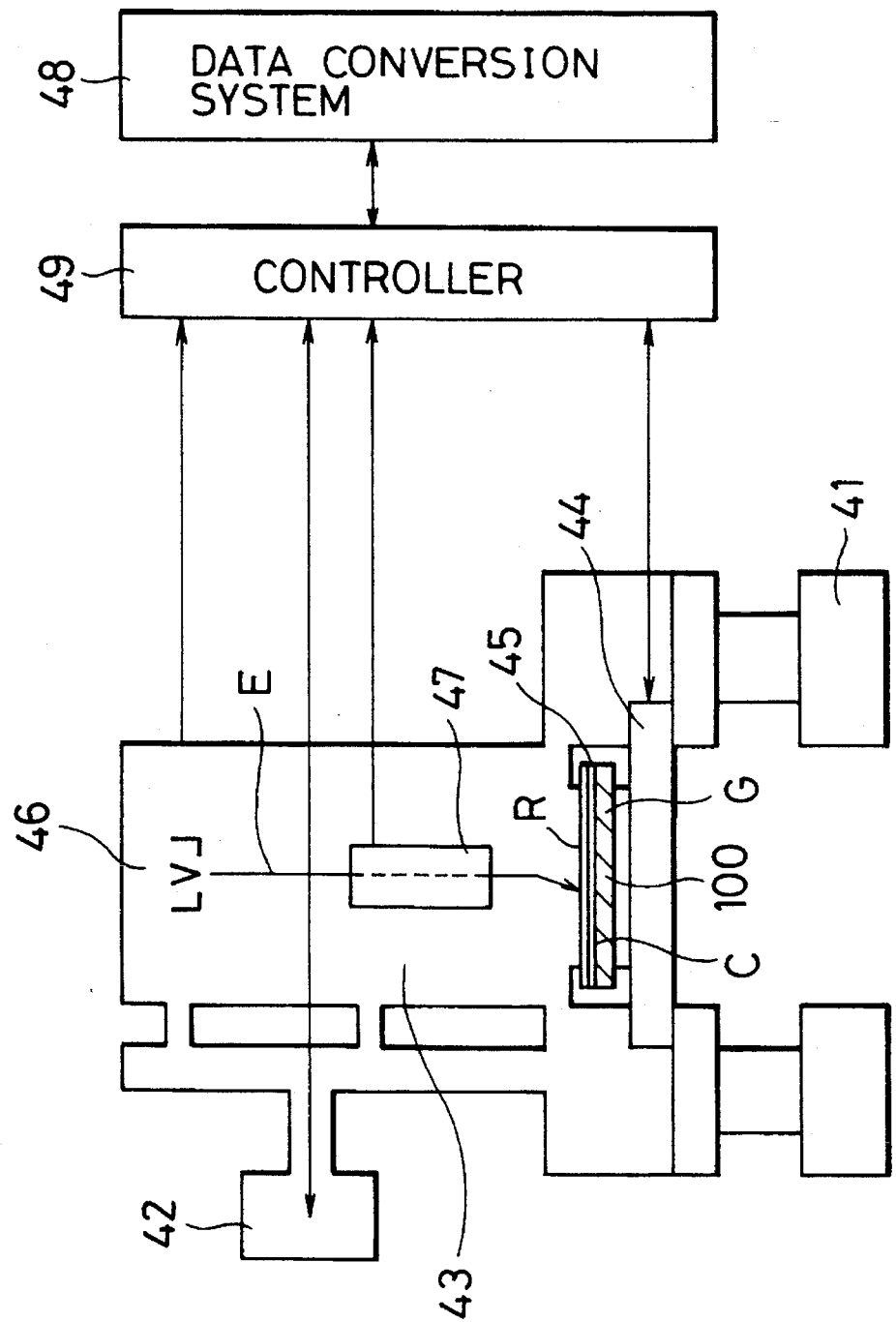
FIG. 2 is a schematic view illustrating an apparatus for radiating electron beams to a mask blank.
Figure 3A:
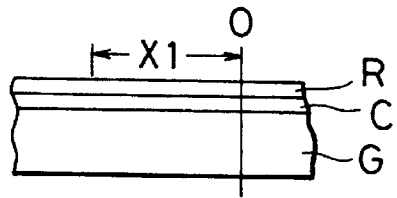
FIGS. 3A, 3B, 3C and 3D are partial cross-sectional views showing a relationship between a curvature of a mask blank and a dislocation of a circuit pattern.
Figure 3B:
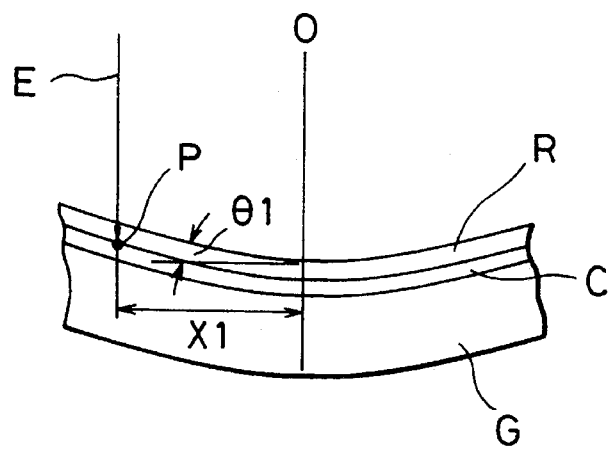
Figure 3C:
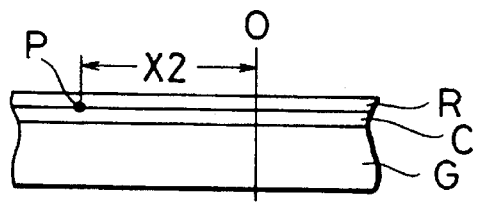
Figure 3D:
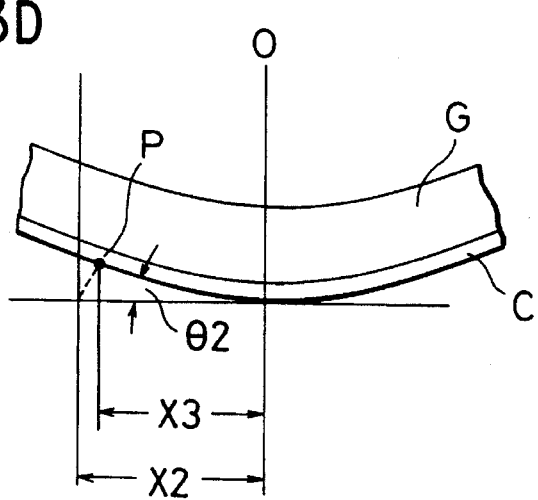
Figure 5:
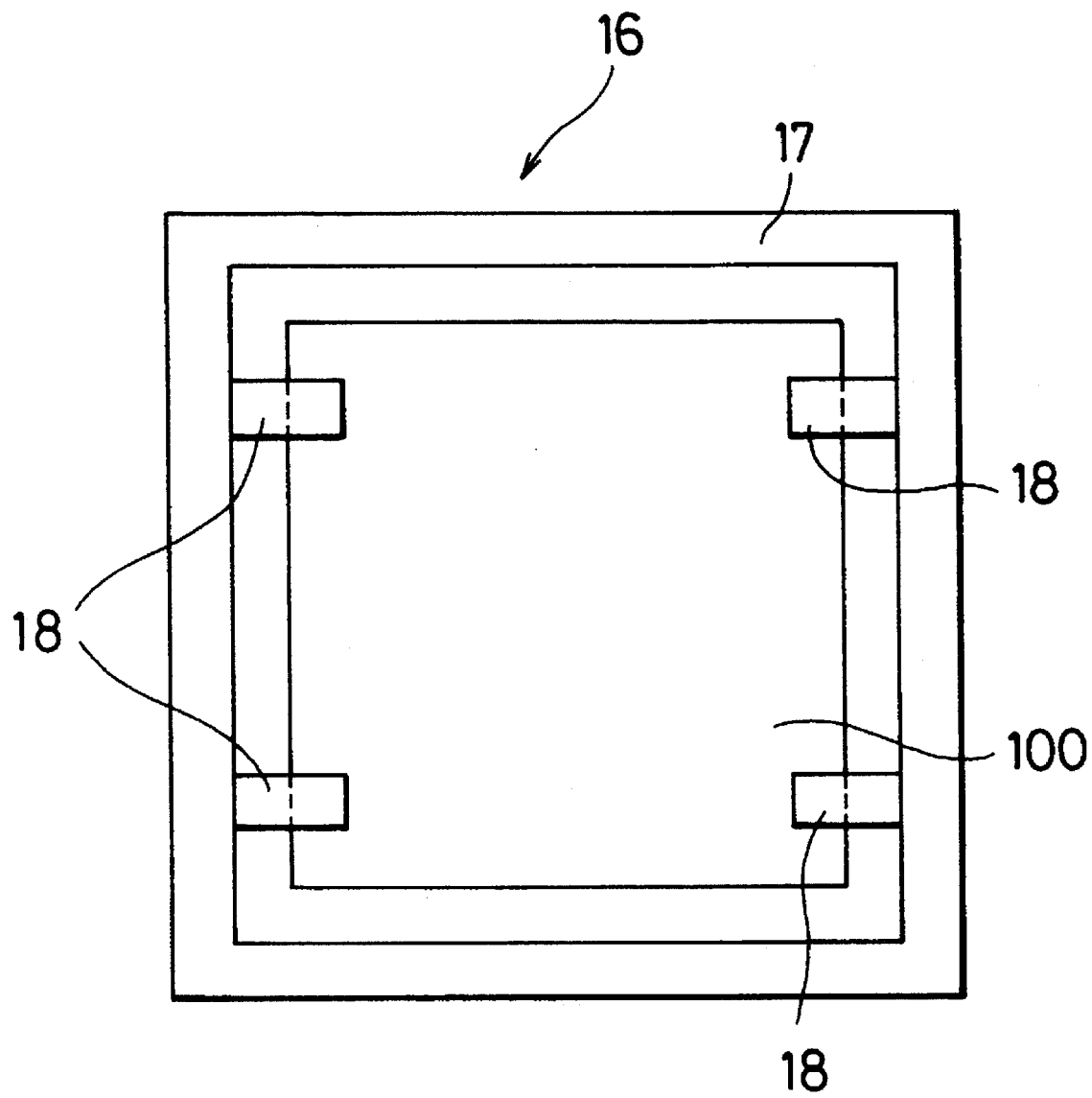
FIG. 5 is a bottom plan view of a holder.

As illustrated in FIG. 5, the holder 16 comprises a frame 17 having a larger dimension than the mask blank 100. The frame 17 is provided at opposing internal sides thereof with totally four clamps 18 projecting inwardly of the frame 17. The mask blank 100 is held at four positions thereof with the clamps 18. The holder 16 has the same structure as that of the holder 34 illustrated in FIG. 1 for holding a reticle in a stepper.

In the vacuum chamber 13, an electron gun 19 and an electronic optical system 20 are disposed below the mask blank 100. The electronic optical system 20 deviates electron beams radiated from the electron gun 19, and directs the deviated electron beams toward the mask blank 100. The X-Y stage 14, the electron gun 19 and the electronic optical system 20 are electrically connected to and controlled by a controller 22 including therein a data conversion system 21.

The mask blank 100 is supported by the holder 16 so that the chromium layer C and the resist R face downwardly. Electron beams E radiated from the electron gun 19 are optimized by the electronic optical system 20, and then are radiated to the mask blank 100. Before the electron beams E are radiated to the mask blank 100, data for designing a circuit pattern is converted by the date conversion system 21 to a format suitable for image-formation. The controller controls the electronic optical system 20 and the X-Y stage 14 based on the format, and thereby a desired pattern is formed on the mask blank 100.

Subsequently to the formation of the pattern on the mask blank 100, the resist R is developed and then the chromium layer C is etched using the residual resist R as a mask. Thus, a reticle having a desired pattern is obtained.

In accordance with the embodiment, when the mask blank 100 is exposed to the electron beams, the mask blank 100 is being held by the holder 16 in the same situation as that in which the mask blank 100 is held in a stepper. Namely, the mask blank 100 is held only at peripheral portions thereof by the holders 16 and 34 with the chromium layer C being located under the glass substrate G. Accordingly, the glass substrate G held in the electron beam exposure apparatus has the same curvature as that of the glass substrate G held in the stepper. Thus, in the stepper, the semiconductor wafer is exposed to a pattern completely identical to a pattern formed in an electron beam exposure apparatus. Hence, it is possible to align a circuit pattern to a semiconductor wafer with high accuracy.

In the embodiment, since a contact portion of the X-Y stage 14 and the stage table 15 is located above the mask blank 100, there is a risk that foreign materials may come out of the contact portion and attach to the mask blank 100. However, since the chromium layer C is located under the glass substrate G, such foreign materials may attach to the glass substrate G, but cannot or can scarcely attach to the chromium layer C. Thus, even if foreign materials come out of the contact portion, they do not adversely effect a circuit pattern on the mask blank. Even so, it is necessary to prevent generation of foreign materials such as particles. Accordingly, the contact portion of the X-Y stage 14 and the stage table 15 is arranged as small as possible, and further the contact portion is disposed remotely from the mask blank 100.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of manufacturing a reticle having a desired pattern and being used with said desired pattern facing downwards in a stepper to expose a semiconductor wafer arranged below said reticle to transmitted light projected from a light source arranged above said reticle and transmitted through said reticle, said method comprising the steps of:

(a) placing a mask blank on a holder, said mask blank comprising a glass substrate and a sensitive layer, said sensitive layer facing downward;

(b) projecting electron beams from an electron gun positioned beneath a surface of said sensitive layer to expose said sensitive layer to the electron beams; and (c) generating said desired pattern on said sensitive layer to thereby, manufacture said reticle, said mask blank being held in place by said holder in a same relationship between a direction of a curvature of said mask blank and a direction in which said electron beams are projected, with respect to a relationship in which said stepper exposes said semiconductor wafer to said transmitted light through said reticle.

2. The method as recited in claim 1, wherein said glass substrate further has a light cut-off layer applied thereon.

3. The method as recited in claim 1, wherein said reticle is held only at edge portions thereof both when electron beams are projected to said reticle and when said stepper exposes said semiconductor wafer to light through said reticle.

4. A method of manufacturing a reticle having a desired pattern and being used with said desired pattern facing downwards in a stepper to expose a semiconductor wafer arranged below said reticle to transmitted light protected from a light source arranged above said reticle and transmitted through said reticle, comprising the steps of;

(a) placing a mask blank on a holder, said mask blank comprising a glass substrate and a sensitive layer, said sensitive layer facing downward;

(b) projecting electron beams from an electron gun positioned beneath a surface of said sensitive layer to expose said sensitive layer to said electron beams; and (c) generating said desired pattern on said sensitive layer, wherein said sensitive layer and said glass substrate of said mask blank are held in a same positional relationship during the manufacturing of said reticle as when said reticle is positioned in said stepper to expose said semiconductor wafer to said transmitted light.

5. The method as recited in claim 4, wherein said glass substrate further has a light cut-off layer applied thereon.

6. The method as recited in claim 4, wherein said reticle is held only at edge portions thereof both when downward electron beams are projected to said reticle and when said stepper exposes said semiconductor wafer to said transmitted light through said reticle.

* * * * *